United States Patent [19]
Nasserbakht

[11] Patent Number: 5,534,793
[45] Date of Patent: Jul. 9, 1996

[54] PARALLEL ANTIFUSE ROUTING SCHEME (PARS) CIRCUIT AND METHOD FOR FIELD PROGRAMMABLE GATE ARRAYS

[75] Inventor: Mitra Nasserbakht, Dallas, Tex.

[73] Assignee: Texas Instruments Incorporated, Dallas, Tex.

[21] Appl. No.: 378,036

[22] Filed: Jan. 24, 1995

[51] Int. Cl.$^6$ .................................................. H03K 19/173
[52] U.S. Cl. ............................... 326/44; 326/38; 327/525
[58] Field of Search ............................ 326/38, 39, 41, 326/44, 45; 327/525

[56] References Cited

U.S. PATENT DOCUMENTS

| | | | |
|---|---|---|---|
| 4,758,745 | 7/1988 | Elgamal | 326/44 |
| 5,276,653 | 1/1994 | McKenney | 327/525 |
| 5,349,248 | 9/1994 | Parlour | 327/525 |
| 5,396,126 | 3/1995 | Britton | 326/39 |
| 5,399,923 | 3/1995 | Webster | 327/525 |

*Primary Examiner*—Edward P. Westin
*Assistant Examiner*—Andrew Sanders
*Attorney, Agent, or Firm*—Mark A. Valetti; W. James Brady, III; Richard L. Donaldson

[57] ABSTRACT

The parallel antifuse scheme may be applied to a field programmable gate array architecture (10) having a logic module (16) with an output coupled to an output track (34, 54, 114, 144, 178, 198) coupled via a cross antifuse (38, 58, 116, 184, 208) to an connecting track (36, 56, 64, 118, 154, 182, 205, 206). The connecting track is further coupled via at least one cross antifuse (44, 46, 72, 74, 120, 122, 160, 162, 190, 218, 220) to at least one input track (40, 42, 68, 70, 188, 214, 216) coupled to an input of at least one logic module. The circuit includes a compensation track (124, 150, 180, 200) running generally in parallel with the output track and at least one parallel antifuse (125, 158, 186, 212) programmably coupling the compensation track (124, 150, 180, 200) and the connecting track. One or more controllable switch (130, 152, 174, 176, 194, 196), such as a pass transistor, is coupled between the output track and the compensation track.

10 Claims, 4 Drawing Sheets

PARALLEL ANTIFUSE ROUTING SCHEME (PARS) CIRCUIT AND METHOD FOR FIELD PROGRAMMABLE GATE ARRAYS

TECHNICAL FIELD OF THE INVENTION

This invention relates in general to the field of electronic devices. More particularly, the present invention relates to a parallel antifuse circuit and method for field programmable gate arrays.

BACKGROUND OF THE INVENTION

The field programmable gate array (FPGA) has enjoyed popularity as application-specific integrated circuits (ASICs) due to its advantages of relatively high gate density, short design cycle, and low cost. Due to its field-programmable capability, the FPGA has been widely used to replaced small and medium-scale integration devices (SSI and MSI), programmable logic devices (PLDs), and mask-programmable gate arrays in applications that do not require a very large number of gates and very high speed. FPGAs are also used to build prototypes of high density, high speed custom chips and ASIC devices in which a number of FPGAs may be used for emulation purposes.

A typical FPGA architecture is composed of a two-dimensional array of logic modules that may be selectively connected with vertical and horizontal tracks. The logic modules may be arranged in a matrix or in rows and columns. In the row/column-based FPGA architecture, the antifuse is the programming element which interconnect the logic modules. Two adjacent segments of horizontal/vertical routing tracks may be connected by programming a horizontal/vertical antifuse. Antifuses are also positioned at intersections of vertical and horizontal tracks to route signals from horizontal tracks to vertical tracks or vice versa.

To program an antifuse, a predetermined amount of programming current, $I_{SOAK}$, is passed through the device. In addition, there is an upper limit, $I_{PEAK}$, on the amount of current that is permitted to pass through the antifuse. Traditionally, a typical widely used antifuse device has had very attractive parameters (low resistance and capacitance) compared to other FPGA programming technologies such as SRAM based devices, hence allowing much faster and smaller programming technology. The newer types of antifuses that are gaining popularity rapidly, have even more attractive on-state-resistances and loading capacitances. However, as the antifuse technology progresses, the $I_{PEAK}$ to $I_{SOAK}$ ratio becomes more critical. An example of such an antifuse device is the amorphous silicon antifuse. In the high performance amorphous silicon antifuse device, unpredictable and undesirable behavior is observed when the ratio of $I_{PEAK}$ to $I_{SOAK}$ exceeds a certain threshold.

Various methods have been explored to limit the current passing through the amorphous silicon antifuse. One proposal increases the resistance in each antifuse. The result is significant speed degradation of the FPGA. At the output of each logic module is an output driver which drives the lines or tracks that the antifuses are located. Some have attempted to limit the antifuse current by putting restrictions on the output driver. For example, one method limits the fanout of output drivers of each logic module, and another scales down the size of the output drivers. When the output drivers are required to provide less fanout, or its size is scaled back, the amount of current drawn by the output driver decreases and thereby decreasing the current through the antifuse. However, these methods either put unacceptable limitations on the device architecture or adversely affect the speed of the device. Additional output buffers have also been added to the logic modules to decrease the amount of output current from each driver with the unacceptable result of requiring potentially large real estate for the added circuit and routing lines. Yet another method, decreasing the voltage swing at the output of the logic modules, adversely impacts the speed of the FPGA device.

Accordingly, a need has arisen for a method or circuit arrangement that reduces the maximum current through the antifuse without any speed degradation and large penalty on real estate.

SUMMARY OF THE INVENTION

In accordance with the present invention, a parallel antifuse circuit and a method to perform the same are provided which eliminates or substantially reduces the disadvantages associated with prior current compensation circuits and methods.

In one aspect of the invention, the parallel antifuse scheme may be applied to a field programmable gate array architecture having a logic module with an output coupled to an output track coupled via a cross antifuse to an connecting track. The connecting track is further coupled via at least one cross antifuse to at least one input track coupled to an input of at least one logic module. The circuit includes a compensation track running generally parallel with the output track, and a parallel antifuse programmably coupling the compensation track and the connecting track. A controllable switch, such as a pass transistor, is coupled between the output track and the compensation track.

In another aspect of the invention, there is provided a compensation track running generally parallel with the output track, and a parallel antifuse coupled between the compensation track and the connecting track. A first controllable switch is coupled between the output of the logic module and the output track, and a second controllable switch is coupled between the output of the logic module and the compensation track.

A technical advantage of the instant invention is the reduction or minimizing of failure rates of amorphous silicon antifuses due to high peak currents. The present invention reduces the current flow through the antifuses without limiting the architecture of the FPGA, speed degradation, or large real estate penalty.

BRIEF DESCRIPTION OF THE DRAWINGS

For a better understanding of the present invention, reference may be made to the accompanying drawings, in which.

DETAILED DESCRIPTION OF THE INVENTION

The preferred embodiment of the present invention and its advantages are best understood by referring to FIGS. 1–8 of the drawings, like numerals being used for like and corresponding parts of the various drawings.

Figure 1:
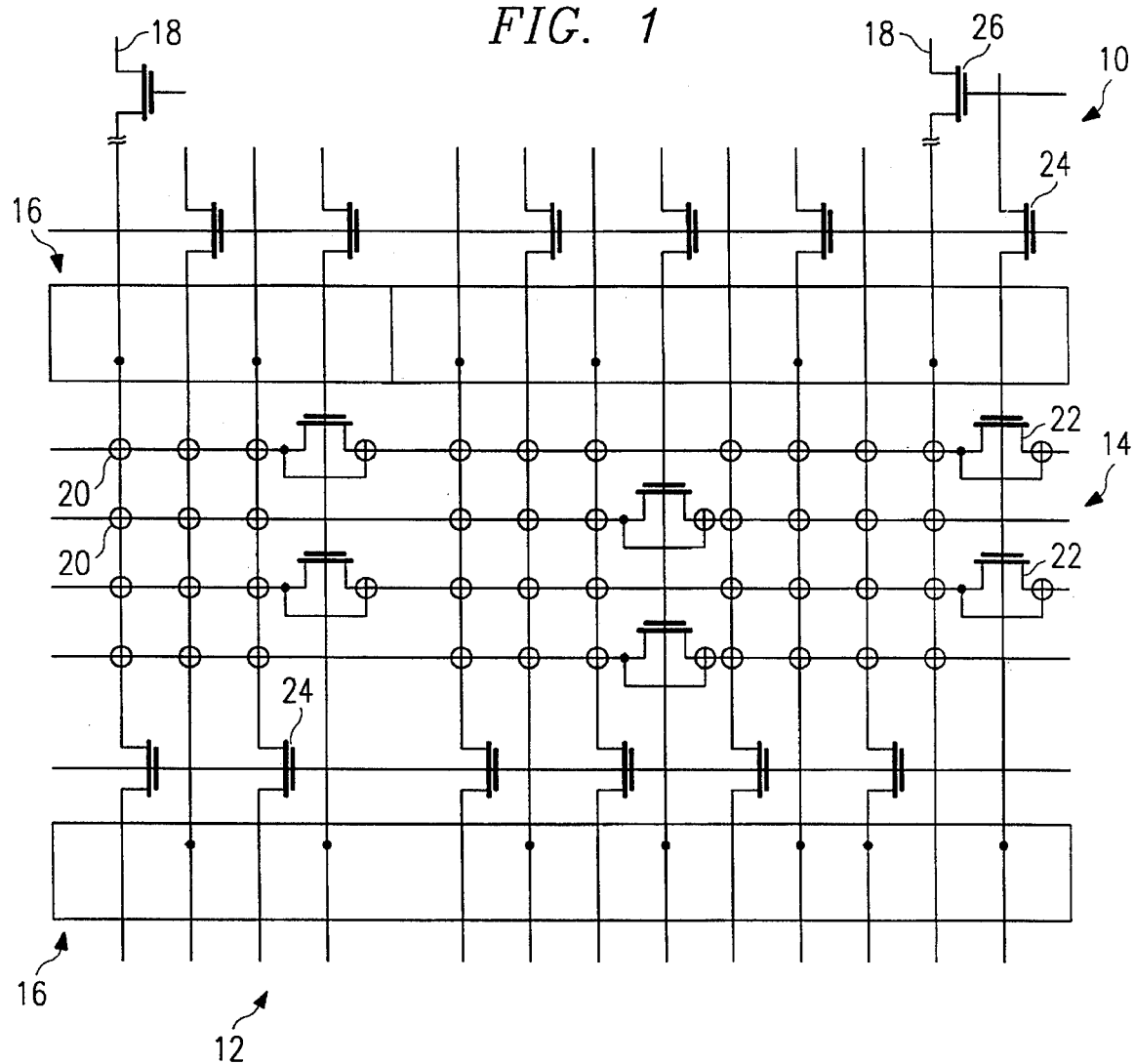
FIG. 1 is a representative diagram of an antifuse-based FPGA device.

Referring to FIG. 1, a representative antifuse-based field programmable gate array (FPGA) architecture 10 includes a plurality of vertical tracks 12 and a plurality of horizontal tracks 14 delivering input signals to logic modules 16 and delivering output signals therefrom to other logic modules. As shown, the logic modules 16 are organized in rows, but the present invention may be equally applicable to other logic module arrangements. Of the vertical tracks 14, some are designated as uncommitted vertical tracks 18, which span longer distances across multiple logic modules. The uncommitted vertical tracks 18 are typically used to route signals to another part of the device. Antifuses 20 are positioned at the intersection of the vertical and horizontal tracks 12 and 14. When blown, the antifuse acts as a short and an electrical connection is made between the intersecting tracks. Additionally, horizontal pass transistors 22 are used to segment the horizontal tracks 14, and vertical pass transistors 24 and 26 are used to segment the vertical and uncommitted vertical tracks, respectively.

Figure 2:
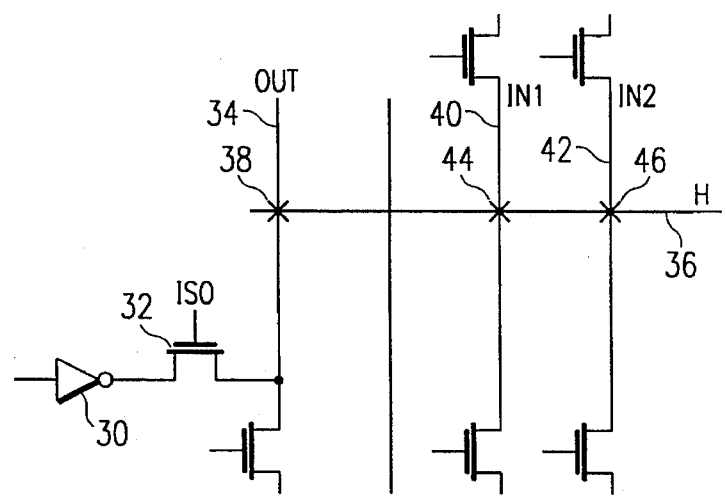
FIG. 2 is a representative routing diagram of the antifuse-based FPGA device.

It may be instructive to discuss in more detail the existing routing architecture in order to better contrast and highlight the solution in the present invention. Referring to FIG. 2, an output driver 30 connected to the output of a logic module is further coupled to an isolation device 32. The isolation device 32, under the control of a signal, ISO for example, passes the output from the logic module to a vertical output track 34. The vertical output track 34 may be electrically connected to an horizontal track 36 by a blown antifuse 38. Blow antifuses are shown as Xs in the drawings. The horizontal track 36 may be electrically connected to vertical input tracks 40 and 42 by blown antifuses 44 and 46, respectively, to deliver the output to the input of other logic modules. During operation, a current flows through the blown antifuse 38 from the vertical track 34 to the horizontal track 36. When this current exceed a certain maximum limit, the antifuse 38 may behave unpredictably. In FPGAs employing the amorphous silicon antifuse device, the maximum current limit may be easily reached during normal circuit operations, causing the antifuses to fail.

Figure 3:
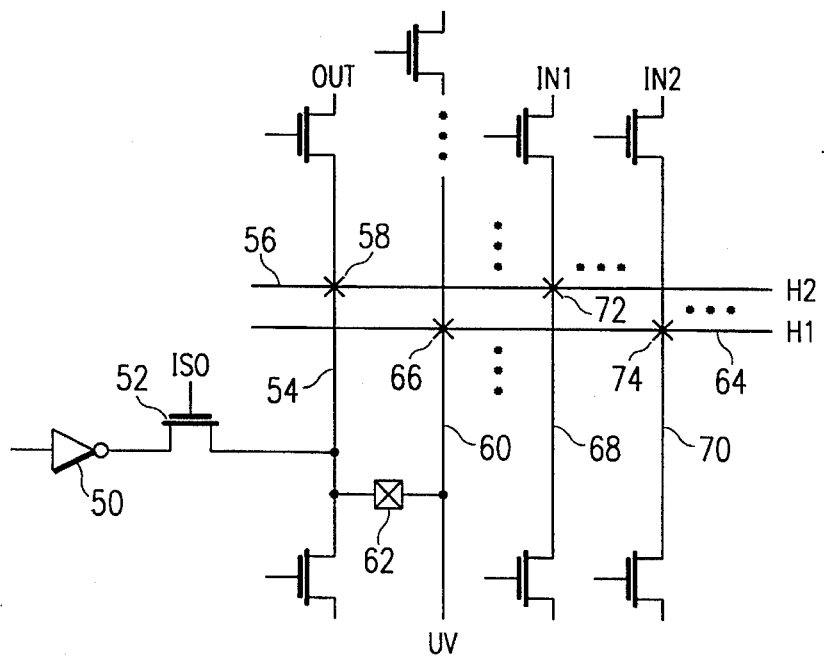
FIG. 3 is a representative routing diagram of the antifuse-based FPGA device.

Referring to FIG. 3, an existing routing architecture in which an uncommitted vertical track is used is shown. An output driver 50 connected to the output of a logic module is further coupled to an isolation device 52. The isolation device 52 is connected to a vertical output track 54, which may be electrically connected to an horizontal track 56 by a blown antifuse 58. The vertical output track 54 may be further connected to an uncommitted vertical track 60 by a blown antifuse 62. The blown antifuse 62 between the vertical track 54 and the uncommitted vertical track 60 are shown as ⊠ in the drawings. The uncommitted vertical track 60 may be connected to another horizontal track 64 by a blown antifuse 66. The horizontal tracks 58 and 66 may then be electrically connected to vertical input tracks 68 and 70 by blown antifuses 72 and 74, respectively. In this scenario, antifuses 58, 62, and 66 may encounter the high operating current that may cause them to behave erratically or fail.

Figure 4:
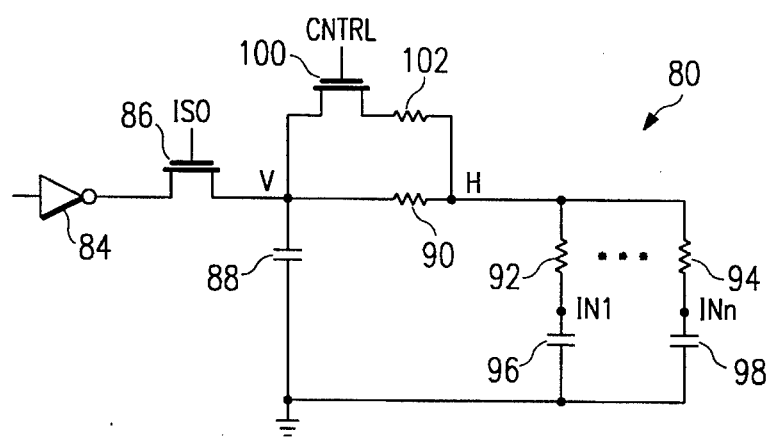
FIG. 4 is a simplified schematic representation of a first embodiment of the parallel antifuse scheme.

Referring to FIG. 4, the parallel antifuse circuit and method of the present invention may be generally illustrated by circuit 80. A logic module 82 provides an output signal to an output driver 84, which is in turn coupled to an isolation device 86. The isolation device is connected to a node V, indicative of the vertical output track described above. A capacitor 88 coupled between node V and ground represents the parasitic capacitance in the vertical track. The node V is coupled to a node H, representing the horizontal track, by a blown antifuse represented by a resistor 90. Note that this is the antifuse that may experience the high operating current. The node H is coupled to the vertical input tracks, IN1 to INn, by blown antifuses represented by resistors 92 and 94, respectively. Capacitors 96 and 98 represent the parasitic capacitances in the vertical input tracks.

The parallel antifuse scheme adds one or more pass transistors 100 and antifuses 102 positioned in parallel with the antifuse 90, so that the current passing through each antifuse 90 and 102 are substantially reduced. The path to the parallel antifuse 102 is controlled by a signal CNTRL coupled to the gate of the pass transistor 100. If the resistivity of the antifuses 90 and 102 are the same, the equivalent resistance seen between nodes V and H is R/2, where R is the resistivity of one antifuse. If the amount of current varied linearly with the resistance, a total current of the quantity 2I may be expected to flow through the two nodes, where I is the amount of current passing through the antifuse 90 previously. However, since I increases only slightly with decreasing R, the effect is a reduction of the current through each antifuse 90 and 102 by slightly less than one half, or I/2.

Figure 5:
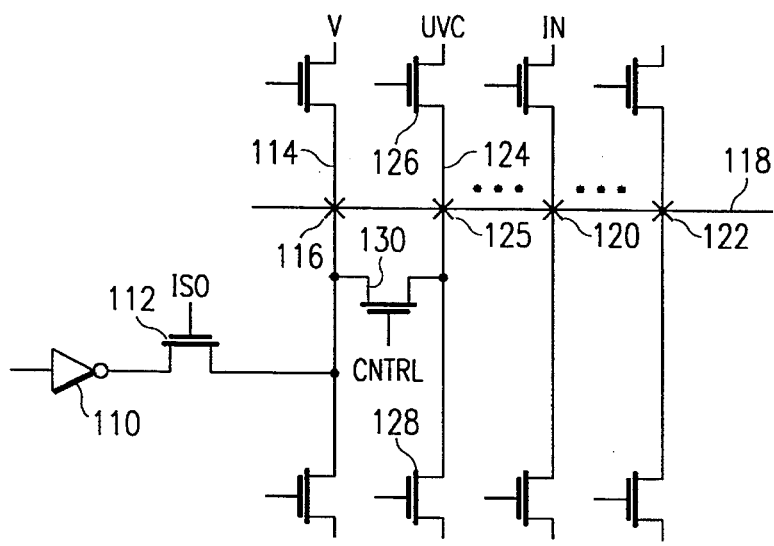
FIG. 5 is a representative routing diagram of the first embodiment of the parallel antifuse scheme.

FIG. 5 shows the application of the parallel antifuse scheme to the FPGA routing architecture in FIG. 2. An output driver 110 is coupled to a pass transistor 112 controlled by ISO, which is coupled to a vertical output track 114. The vertical output track 114, shorted by a blown antifuse 116, is coupled to an horizontal track 118. The horizontal track 118 routes the output signal to the vertical input tracks via blown antifuses 120 and 122. The parallel antifuse scheme adds an additional track 124, vertical in this case, to the routing architecture. Alternatively, an existing but unused segment of a track may also be used to implement the parallel antifuse method. The uncommitted vertical compensation track 124 is added and electrically connected to the horizontal track via a blown antifuse 125. A programmable connection is provided between the vertical output track 114 and the uncommitted vertical compensation track 124 by a pass transistor 130 gated with the control signal, CNTRL. As shown, the uncommitted vertical compensation track 124 may be segmented with pass transistors 126 and 128 controlled with the appropriate signals as known in the art.

During antifuse programming, the pass transistor 130 is turned off to isolate the antifuses 116 and 125, so that they may be programmed or blown separately as known in the art. During circuit operation, the pass transistor 130 is turned on to allow current to pass through both antifuses 116 and 125, effectively lowering the current going through them.

Figure 6:
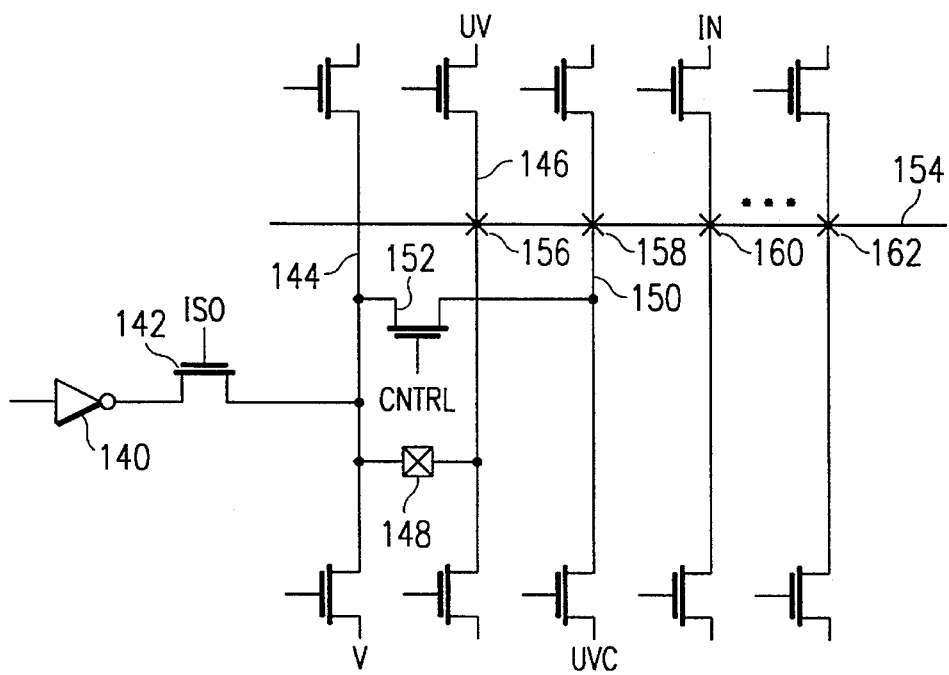
FIG. 6 is another representative routing diagram of the first embodiment of the parallel antifuse scheme.

Referring to FIG. 6, the parallel antifuse scheme is shown being applied to a routing scenario where an uncommitted vertical track is used. An output driver 140 delivers an output signal from a logic module to an isolation transistor 142, which is coupled to a vertical output track 144. The vertical output track 144 is coupled to a uncommitted vertical track 146 by a blown antifuse 148. The vertical output track 144 is further programmably coupled to an uncommitted vertical compensation track 150 by a pass transistor 152 controlled by CNTRL. The uncommitted vertical track 146 is further coupled to an horizontal track 154 by a blown antifuse 156. The uncommitted vertical compensation track 150 is further coupled to the horizontal track 154 via a blown antifuse 158. The horizontal track 154 is further coupled to the vertical input tracks via blown antifuses 160 and 162, for example. Constructed in this manner, the antifuses 156 and 158 may be arranged in parallel to reduce the current passing therethrough by turning the pass transistor 152 on after the antifuses 156 and 158 are programmed.

Figure 7:
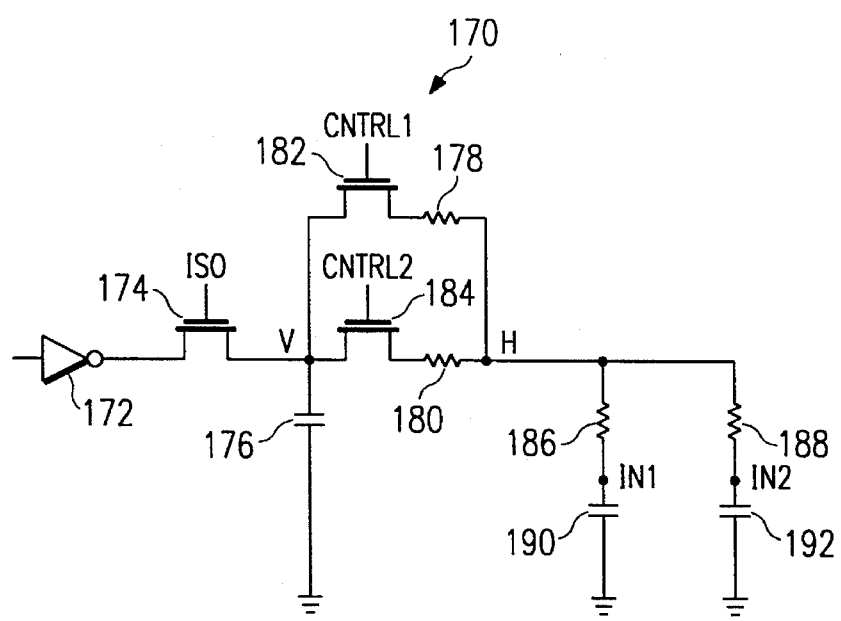
FIG. 7 is a simplified schematic representation of a second and preferred embodiment of the parallel antifuse scheme.

FIG. 7 is a simplified schematic representation diagram 170 of a second embodiment of the invention. An output driver 172 is coupled to an isolation transistor 174. A capacitor 176 coupled to the output of the isolation transistor 174 represents the parasitic capacitance in the vertical output track, which is indicated by node V. The isolation transistor 174 is coupled to the horizontal track or node H via parallel programmed antifuses 178 and 180. The paths from the output track to the antifuses 178 and 180 are controlled by two pass transistors 182 and 184, respectively. The horizontal track is coupled to the input tracks IN1 and IN2 by blown antifuses 186 and 188. Capacitors 190 and 192 represent the parasitic capacitances in the input tracks IN1 and IN2, respectively.

Figure 8:
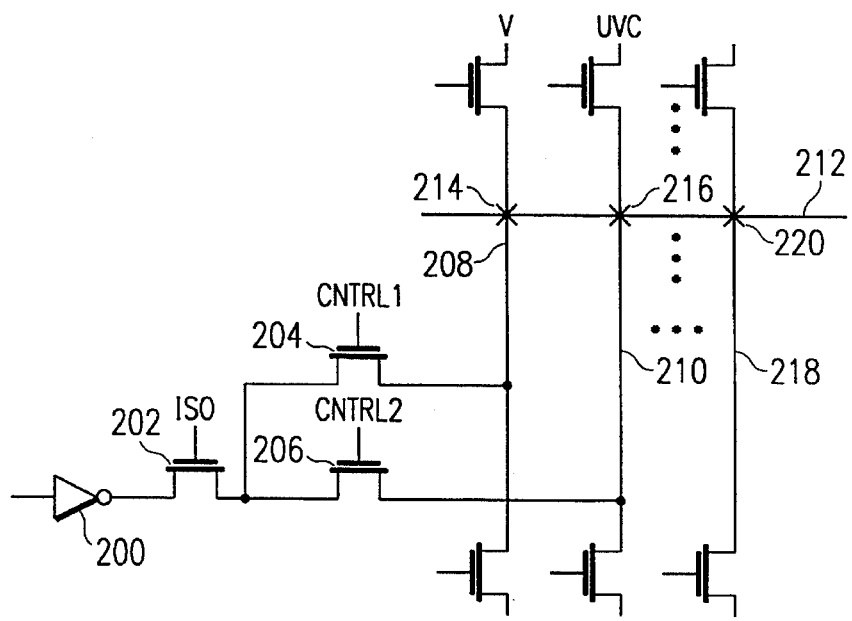
FIG. 8 is a representative routing diagram of the second embodiment of the parallel antifuse scheme.
Figure 9:
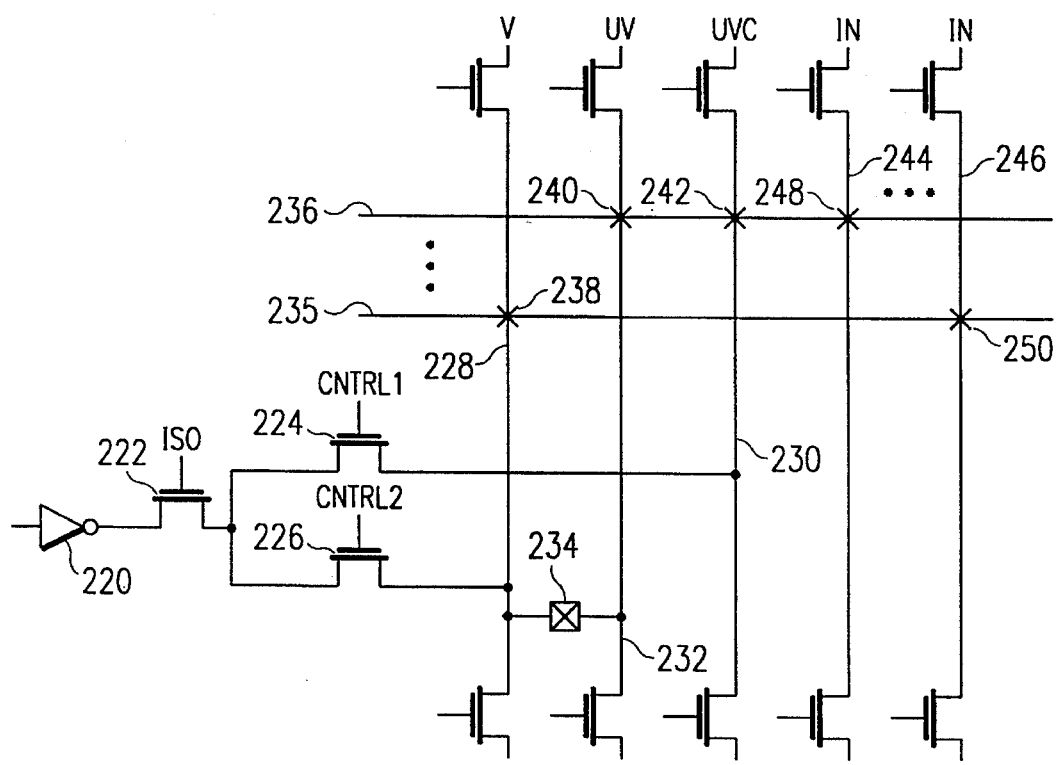
FIG. 9 is another representative routing diagram of the second embodiment of the parallel antifuse scheme.

Referring to FIGS. 8 and 9, the preferred embodiment of the parallel antifuse scheme shown in FIG. 7 is applied to the representative routing architecture. In FIG. 8, no uncommitted vertical tracks are used. An output driver 200 is coupled to an isolation transistor 202, which is further coupled to two parallel pass transistors 204 and 206 controlled by signals CNTRL1 and CNTRL2, respectively. The pass transistors 204 and 206 connect and provide, respectively, the output signal to a vertical output track 208 and a uncommitted vertical compensation track 210. The vertical output track 208 and the uncommitted vertical compensation track 210 are coupled to a horizontal track 212 via blown antifuses 214 and 216, respectively. The horizontal track 212 routes the output signal to one or more vertical input track 218, being connected by respective blown antifuses 220. By selectively controlling the pass transistors 204 and 206 during antifuse programming, the antifuses 214 and 216 may be programmed in turn as known in the art. Subsequently, the blown antifuses may be arranged in parallel by turning both transistors 204 and 206 on.

Referring to FIG. 9, an output driver 220 of a logic module passes the output signal therefrom to an isolation transistor 222, which is coupled to two parallel pass transistors 224 and 226 controlled by CNTRL1 and CNTRL2, respectively. The pass transistors 226 and 224 couple the output signal to a vertical output track 228 and an uncommitted vertical compensation track 230, respectively. The vertical output track 228 is further coupled to an uncommitted vertical track 232 by a blown antifuse 234. Two horizontal tracks 235 and 236 are shown in this exemplary routing scenario to route the output signal to other vertical tracks. The vertical output track 228 is connected to the horizontal track 235 by a blown antifuse 208, and the uncommitted vertical track 232 is connected to the horizontal track 236 by a blown antifuse 240. The horizontal track 236 is coupled to the uncommitted vertical compensation track 230 by a blown antifuse 242, an to an input track 244 by a blown antifuse 248. The horizontal track 235 is coupled to another input track 246 by a blown antifuse 250. After programming, the antifuses 238, 240, and 242 may be arranged in parallel by turning both transistors 224 and 226 on to allow current to pass therethrough. Accordingly, the current seen by each antifuse is substantially reduced.

Constructed and operated in the manner described above, the parallel antifuse circuit and method reduces the current passing through the antifuses and thus reducing the failure rate of these devices. Compared with other $I_{PEAK}$ compensation methods, the present invention is capable of reducing the current significantly without large penalties on real estate or speed.

It is important to note that the vertical and horizontal sense of the tracks shown and discussed above is exemplary and for the purpose of illustrating the invention. The present invention may be equally applicable to other FPGA routing architectures that may not exhibit similar routing track arrangements. In addition, the pass transistors shown herein are n-channel transistors but are not so limited. P-channel transistors, CMOS pass gates, and any controllable switch may be used.

Although the present invention and its advantages have been described in detail, it should be understood that various changes, substitutions and alterations can be made therein without departing from the spirit and scope of the invention as defined by the appended claims.

What is claimed is:

1. A field programmable gate array architecture having a logic module with an output coupled to an output track coupled via a cross antifuse to an connecting track, said connecting track being coupled via at least one cross antifuse to at least one input track coupled to an input of at least one logic module, comprising:

a compensation track running generally parallel with said output track;

a parallel antifuse programmably coupling said compensation track and said connecting track; and a controllable switch coupled between said output track and said compensation track, wherein said controllable switch is an n-channel transistor.

2. The field programmable gate array, as set forth in claim 1, wherein said controllable switch is an n-channel transistor having a gate receiving a control signal.

3. A field programmable gate array architecture having a logic module with an output coupled to an output track coupled via a cross antifuse to an connecting track, said connecting track being coupled via at least one cross antifuse to at least one input track coupled to an input of at least one logic module, comprising:

a compensation track running generally parallel with said output track;

a parallel antifuse programmably coupling said compensation track and said connecting track; and a controllable switch coupled between said output track and said compensation track, wherein said controllable switch closes after said cross antifuse and said parallel antifuse are programmed.

4. A field programmable gate array architecture having a logic module with an output coupled to an output track coupled via a cross antifuse to an connecting track, said connecting track being coupled via at least one cross antifuse to at least one input track coupled to an input of at least one logic module, comprising:

a compensation track running generally parallel with said output track;

a parallel antifuse coupled between said compensation track and said connecting track;

a first controllable switch coupled between said output of said logic module and said output track;

a second controllable switch coupled between said output of said logic module and said compensation track.

5. The field programmable gate array, as set forth in claim 4, wherein said first and second controllable switches are n-channel transistors.

6. The field programmable gate array, as set forth in claim 4, wherein said first and second controllable switches are first and second n-channel transistors each having a gate receiving first and second control signals respectively.

7. The field programmable gate array, as set forth in claim 4, wherein said first and second controllable switches close after said cross antifuse and said parallel antifuse are programmed.

8. The field programmable gate array, as set forth in claims 4, wherein said output track is substantially vertical, said compensation track is substantially vertical, said connecting track is substantially horizontal, and said at least one input track is substantially vertical.

9. A parallel antifuse method for a field programmable gate array having a logic module with an output coupled to an output track coupled via a cross antifuse to an connecting track, said connecting track being coupled via at least one cross antifuse to at least one input track coupled to an input of at least one logic module, the method comprising the steps of:

providing a compensation track running generally parallel with said output track;

programmably coupling said compensation track and said connecting track with a programmable parallel antifuse; and providing a controllable switch coupled between said output track and said compensation track, wherein the step of providing the controllable switch includes the step of providing an n-channel transistor.

10. A parallel antifuse method for a field programmable gate array having a logic module with an output coupled to an output track coupled via a cross antifuse to an connecting track, said connecting track being coupled via least one cross antifuse to at least one input track coupled to an input of at least one logic module, the method comprising the steps of:

providing a compensation track running generally parallel with said output track;

programmably coupling said compensation track and said connecting track with a programmable parallel antifuse; and providing a controllable switch coupled between said output track and said compensation track;

opening said controllable switch;

programming said cross antifuse and said parallel antifuse; and closing said controllable switch.

* * * * *